US010310021B2

(12) United States Patent
Tagade et al.

(10) Patent No.: US 10,310,021 B2
(45) Date of Patent: Jun. 4, 2019

(54) METHOD FOR REAL TIME CORRECTION OF ION CONCENTRATION AND COULOMB COUNTING STATE-OF-CHARGE (SOC) IN BATTERY

(71) Applicant: SAMSUNG ELECTRONICS CO., LTD., Suwon-si (KR)

(72) Inventors: Piyush Madhukarrao Tagade, Bangalore (IN); Krishnan Seethalakshmy Hariharan, Bangalore (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 15/373,017

(22) Filed: Dec. 8, 2016

(65) Prior Publication Data

US 2017/0168119 A1    Jun. 15, 2017

(30) Foreign Application Priority Data

Dec. 11, 2015    (IN) ............................ 6646/CHE/2015

(51) Int. Cl.
*G01R 35/00*    (2006.01)
*H01M 10/48*    (2006.01)
*G01R 31/367*    (2019.01)

(52) U.S. Cl.
CPC .......... *G01R 31/367* (2019.01); *G01R 35/005* (2013.01); *H01M 10/48* (2013.01); *H01M 2220/20* (2013.01)

(58) Field of Classification Search
CPC .................................................. G01R 31/3651
See application file for complete search history.

(56) References Cited

U.S. PATENT DOCUMENTS

| 7,808,210 | B2 | 10/2010 | Darilek |
| 2014/0210418 | A1* | 7/2014 | Wang ........................ H02J 7/00 320/134 |
| 2014/0244193 | A1 | 8/2014 | Balasingam et al. |
| 2014/0244225 | A1 | 8/2014 | Balasingam et al. |
| 2014/0372055 | A1 | 12/2014 | Wang et al. |
| 2015/0081237 | A1 | 3/2015 | Ye et al. |

OTHER PUBLICATIONS

He, Wei, et al. "State of Charge Estimation for Electric Vehicle Batteries Using Unscented Kalman Filtering." *Microelectronics Reliability* 53.6 (2013). (8 pages, in English).
He, Zhiwei, et al. "Adaptive state of charge estimation for Li-ion batteries based on an unscented Kalman filter with an enhanced battery model." *Energies* 6.8 (2013): 4134-4151. (18 pages, in English).

* cited by examiner

*Primary Examiner* — Manuel A Rivera Vargas
(74) *Attorney, Agent, or Firm* — NSIP Law

(57) ABSTRACT

A method includes estimating an average concentration of ions in electrodes of a battery and estimating a state-of-charge (SOC) of the battery by Coulomb counting, correcting the ion concentration based on a difference in predicted and measured cell voltages, and correcting the Coulomb counting SOC based on a relation between SOC estimated by Coulomb counting and the average concentration, and the difference in the predicted and measured cell voltages.

13 Claims, 21 Drawing Sheets

METHOD FOR REAL TIME CORRECTION OF ION CONCENTRATION AND COULOMB COUNTING STATE-OF-CHARGE (SOC) IN BATTERY

CROSS-REFERENCE TO RELATED APPLICATIONS

This application claims the benefit under 35 USC § 119(a) of Indian Patent Application No. 6646/CHE/2015 filed on Dec. 11, 2015 in the Indian Patent Office, the entire disclosure of which is incorporated herein by reference for all purposes.

BACKGROUND

1. Field

The following description relates to a battery management system. The following description also relates to a mechanism for real time correction of ion concentration and Coulomb counting state-of-charge (SOC) in a battery.

2. Description of Related Art

Generally, batteries are vital source of stored energy that is incorporated into a number of systems. Rechargeable lithium-ion (Li-ion) batteries are attractive energy storage systems for portable electronics, electric vehicle (EV) and hybrid-electric vehicles (HEV) because of their high specific energy compared to other electrochemical energy storage devices. In particular, batteries made of lithium metal incorporated into the negative electrode afford exceptionally high specific energy, in Wh/kg, and energy density, in Wh/L, compared to batteries with conventional carbonaceous negative electrodes. Li-ion batteries also exhibit lack of hysteresis and low self-discharge currents, which are issues that are detrimental to the operation of other types of batteries. Accordingly, lithium-ion batteries are a promising option for incorporation into EVs, HEVs and plug-in hybrid electric vehicles (PHEV), as discussed above, because of these advantageous properties.

One requirement for incorporation of batteries including Li-ion batteries into EV/HEV/PHEV systems, as discussed above, is the ability to accurately compute the state-of-charge (SOC) and state-of-health (SOH) of such batteries in real time. This requirement is important because it allows measurement of the battery's ongoing ability to act as a source of power. The SOC may be defined as a percentage which reflects the available energy in a cell compared to the available energy of the cell when fully charged.

The critical task of a battery management system is to estimate the SOC accurately and manage health of the system to provide a robust battery. SOC estimation is challenging since simple methods of predicting SOC, such as Coulomb counting, suffer from increased errors over an increased integration time. These increased errors result from biased current measurements or discretization errors that occur during such measurements.

Further, the Coulomb counting SOC estimation method suffers from various drawbacks including zero predictability, insensitivity to the operating voltage range, and instability at realistic drive cycles. Moreover in the existing Coulomb counting method, fault detection is not integrated with state estimation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method includes estimating an average concentration of ions in electrodes of a battery and estimating a state-of-charge (SOC) of the battery by Coulomb counting, correcting the ion concentration based on a difference in predicted and measured cell voltages, and correcting the Coulomb counting SOC based on a relation between SOC estimated by the Coulomb counting and the average concentration, and the difference in the predicted and measured cell voltages.

Correcting the ion concentration based on the difference in the cell voltages may include obtaining a predicted cell voltage while estimating the average concentration of ions, obtaining a measured cell voltage from sensors placed in the battery, and computing the difference between the predicted cell voltage and the measured cell voltage.

Obtaining the predicted cell voltage may include using an unscented Kalman filter (UKF).

The ions in the electrodes may be lithium ions.

The Coulomb counting may take an initial SOC and a current sensor measurement as inputs.

In another general aspect, a battery management system includes a processor configured to estimate an average concentration of ions in electrodes of the battery and estimate a state-of-charge (SOC) of the battery by Coulomb counting, correct the ion concentration based on a difference in predicted and measured cell voltages, and correct the Coulomb counting SOC based on a relation between SOC estimated by the Coulomb counting and the average concentration, and the difference in the predicted and measured cell voltages.

The battery management system may further include a memory configured to store instructions, wherein the processor is further configured to execute the instructions to estimate the average concentration of ions in electrodes of the battery and estimate the state-of-charge (SOC) of the battery by Coulomb counting, correct the ion concentration based on a difference in predicted and measured cell voltages, and correct the Coulomb counting SOC based on the relation between SOC estimated by the Coulomb counting and the average concentration, and the difference in the predicted and measured cell voltages.

The processor may include an estimator configured to estimate the average concentration of ions in electrodes of the battery and estimate the state-of-charge (SOC) of the battery by Coulomb counting, and a corrector configured to correct the ion concentration based on the difference in predicted and measured cell voltages, and correct the Coulomb counting SOC based on the relation between SOC estimated by the Coulomb counting and the average concentration, and the difference in the predicted and measured cell voltages.

The corrector may be configured to correct the ion concentration based on a difference in cell voltages by obtaining a predicted cell voltage while estimating the average concentration of ions, obtaining a measured cell voltage from sensors placed in the battery, and computing the difference between the predicted cell voltage and the measured cell voltage.

Obtaining the predicted cell voltage comprises using an unscented Kalman filter (UKF).

The ions in the electrodes may be lithium ions.

The Coulomb counting may take an initial SOC and a current sensor measurement as inputs.

In another general aspect, a non-transitory computer-readable storage medium stores instructions that, when executed by a processor, cause the processor to estimate an average concentration of ions in electrodes of a battery and estimating a state-of-charge (SOC) of the battery by Coulomb counting, correct ion concentration based on a difference in predicted and measured cell voltages, and correct the Coulomb counting SOC based on a relation between SOC estimated by the Coulomb counting and the average concentration, and the difference in the predicted and measured cell voltages.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
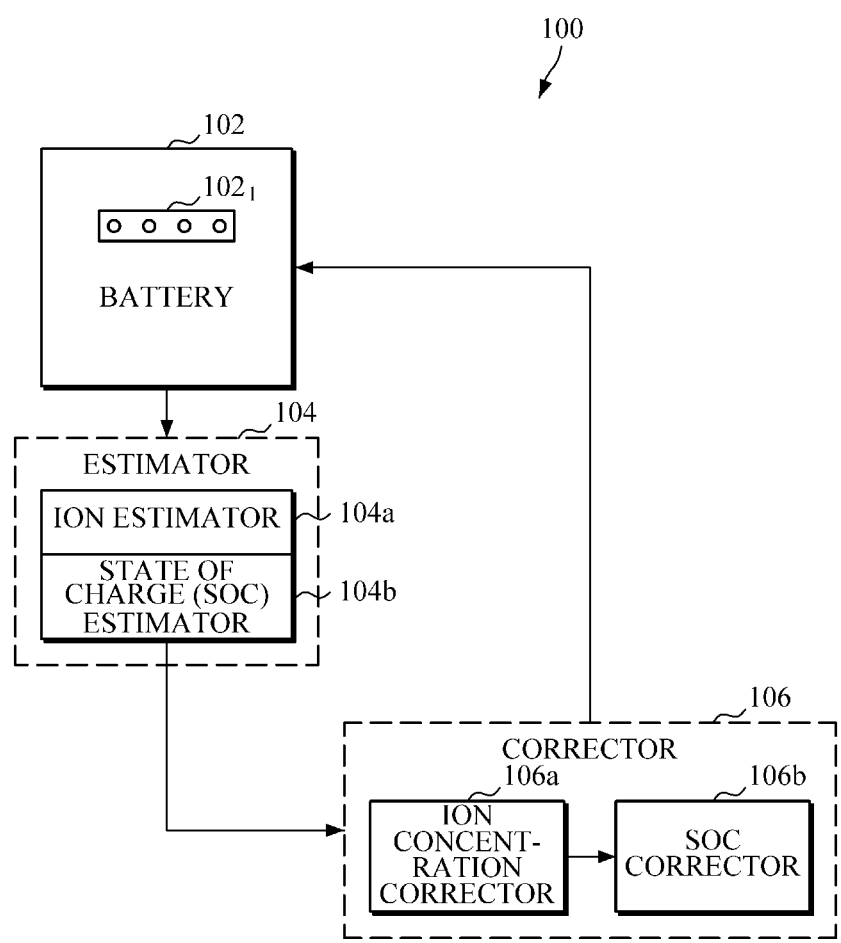
FIG. 1 illustrates a battery management system for correction of ion concentration and Coulomb counting state-of-charge (SOC) in a battery, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Accordingly the examples presented herein provide a method for real time correction of ion concentration and Coulomb counting state-of-charge (SOC) in a battery. The method includes estimating an average concentration of ions in electrodes of the battery and estimating a SOC of the battery by Coulomb counting. In an example, the ions in the electrodes are lithium ions. Further, the method includes correcting the ion concentration based on a difference in predicted and measured cell voltages.

In an example, the predicted cell voltage is obtained while estimating the average concentration of ions.

The measured cell voltage is obtained from a plurality of sensors placed in the battery. In an example, the sensors of the plurality of sensors are voltage sensors.

A difference between the predicted cell voltage and the measured cell voltage is computed to correct the determined ion concentration.

Furthermore, the method includes correcting the Coulomb counting SOC based on a relation between SOC estimated by Coulomb counting and the average concentration, and also the difference in the predicted and measured cell voltages.

Unlike the conventional method, that is, Coulomb counting, the proposed method provides a real time correction of ion concentration and Coulomb counting SOC in the battery. The proposed method may be used to correct the Coulomb counting SOC using the voltage measurement and ion concentration in the electrodes. The proposed method may be used to estimate an accurate SOC during charging and discharging of the ion cell. For example, the proposed method utilizes an unscented Kalman filter (UKF) for estimating the SOC. Such a UKF is an algorithm that uses a series of measurements observed over time, containing statistical noise and other errors sources, and estimates variables by combining the multiple measurements, and the UKF uses a deterministic sampling technique known as the unscented transform to estimate the mean and covariance. The proposed method is robust against the initial SOC and current sensor errors.

Furthermore, the proposed method adapts for rapid changes in load current associated with the realistic drive cycles. The proposed method appropriately accounts for the relaxation during the rest period. The proposed method for real time correction of ion concentration and Coulomb counting SOC in the battery provides an easy to implement method to account for model uncertainty. The model uncertainty appropriately accounts for a faulty system and also for erroneous sensors. The model uncertainty provides an indicator for a faulty system and also for erroneous sensors. A high value of the mean of model uncertainty indicates a highly faulty system or highly faulty erroneous sensors.

Referring now to the drawings, and more particularly to FIGS. 1 through 13 in which similar reference characters denote corresponding features consistently throughout the figures, there are shown various examples.

FIG. 1 illustrates a battery management system 100, according to an example. In the example of FIG. 1, the battery management system 100 includes a battery 102, an estimator 104 and a corrector 106. The estimator 104 includes an ion estimator 104a and a SOC estimator 104b. The corrector 106 includes an ion concentration corrector 106a and a SOC corrector 106b.

The battery 102 includes one or more electrochemical cells that store chemical energy, which is converted to an electrical energy to provide power to a load. In an example, a plurality of sensors $102_1$ is placed within the battery 102 as shown in the example of FIG. 1. The plurality of sensors measure voltage values of the cells in the battery 102.

In an example, the estimator 104 is configured to estimate the average concentration of ions in electrodes of the battery and accordingly to estimate the SOC of the battery by Coulomb counting.

In such an example, the ion estimator 104a is configured to estimate the average concentration of ions in electrodes of the battery.

The battery 102 is defined using a two state variable model. Anode average lithium concentration $\overline{C}_{1n}$ and the average radial concentration gradient $\overline{C}_{1m}$ are used as state variables. Furthermore, volume averaging of the electrochemical model is used to obtain the state equations.

The average solid phase (anode) concentration of ions in the electrodes of battery 102 is given by Equation 1:

$$\frac{d\overline{c}_{1n}}{dt} = -\frac{3I(t)}{a_n F l_n r_n} \quad \text{Equation 1}$$

The average radial concentration gradient is given by Equation 2:

$$\frac{d\overline{c}_{1m}}{dt} + \frac{30 D_{1n}}{r_n^2} \overline{c}_{1m} = -\frac{45}{2r_n^2} \langle j_n \rangle \quad \text{Equation 2}$$

In an example, for a finite time step, the change in average solid phase or anode concentration of ions in the electrodes of battery 102 is given by Equation 3:

$$\Delta \overline{c}_{1n} = -\frac{3I(t)}{a_n F l_n r_n} \Delta t \quad \text{Equation 3}$$

In an example, the SOC estimator 104b is configured to estimate the SOC of the battery 102 by Coulomb counting. The Coulomb counting method may take initial SOC and current sensor measurement values as inputs. At an arbitrary time step t, the Coulomb counting SOC is given by Equation 4:

$$SOC(t) = SOC(t-1) + \frac{I(t) \times \Delta t}{Q_{cell}} \quad \text{Equation 4}$$

In an example, the corrector 106 is configured to correct the ion concentration based on a difference in predicted and measured cell voltages.

Cell voltage measurements are obtained at time intervals using the plurality of voltage sensors $102_1$ situated in the battery 102. The cell voltage data is assimilated with a battery model by using a filtering technique. As the cell voltage prediction is non-linear in nature, an unscented Kalman filter (UKF) is used, as discussed above. The UKF estimates the Kalman gain using the data variance and the cross-covariance between the state and cell-voltage prediction. When using the Kalman gain, correction in the average concentration and the radial concentration gradient is given by Equations 5 and 6:

$$\Delta \overline{C}_{1n,cor} = K_n(V_{exp} - V_{model}) \quad \text{Equation 5}$$

$$\Delta \overline{C}_{1m,cor} = K_{rn}(V_{exp} - V_{model}) \quad \text{Equation 6}$$

Furthermore, in an example, the corrector 106 is configured to correct the Coulomb counting SOC based on a relation between SOC estimated by Coulomb counting and the average concentration, and the difference in cell voltages. From the equations Equation 1, Equation 3, and Equation 4, the relation between the SOC by Coulomb counting and the average ion concentration is derived by using Equation 7 as:

$$\Delta SOC = -\frac{a_n F l_n r_n A}{3Q_{cell}} \Delta \overline{c}_{1n} \quad \text{Equation 7}$$

In an example, the ion concentration corrector 106a is configured to correct the ion concentration based on the difference in the predicted and measured cell voltages. Using a forward Euler scheme for Equation 1 is obtained by using Equation 8 as:

$$\overline{c}_{1n}(k) = \overline{c}_{1n}(k-1) - \frac{3I(k) \times \Delta t}{a_n F l_n r_n A} \quad \text{Equation 8}$$

Substituting Equation 8 in Equation 4 gives the relationship of Equation 9:

$$SOC(k) - SOC(k-1) = -\frac{a_n F l_n r_n A}{3Q_{cell}}(\overline{c}_{1n}(k) - \overline{c}_{1n}(k-1)) \quad \text{Equation 9}$$

In an example, the SOC corrector is configured to correct the Coulomb counting SOC based on the relation between SOC estimated by Coulomb counting and the average concentration, and said difference in cell voltages.

With Equation 9 and Equation 5 the SOC correction is given by Equation 10 as:

$$\Delta SOC, cor = -\frac{a_n F l_n r_n A}{3Q_{cell}} K_n(V_{exp} - V_{model}) \quad \text{Equation 10}$$

Using the SOC correction, the updated SOC is given by Equation 11 as:

$$SOC^u(k) = SOC(k) + \Delta SOC, cor \quad \text{Equation 11}$$

Figure 2:
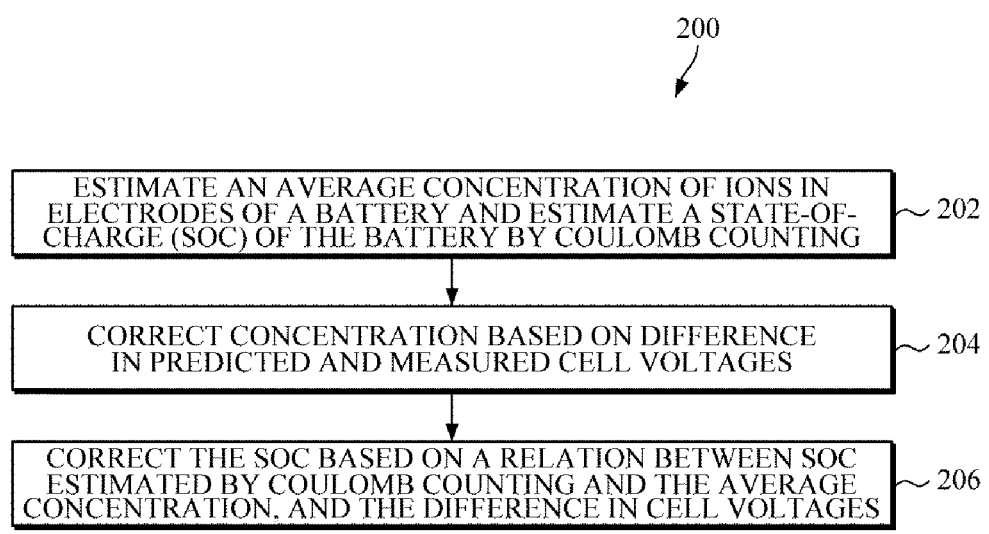
FIG. 2 is a flow chart illustrating a method for real time correction of ion concentration and Coulomb counting SOC in a battery, according to an example.

FIG. 2 is a flow chart illustrating a method 200 for real time correction of ion concentration and Coulomb counting state-of-charge (SOC) in a battery, according to an example. At step 202, the method 200 includes estimating the average concentration of ions in electrodes of the battery 102 and estimating the SOC of the battery 102 by Coulomb counting. The method 200 allows the estimator to 104 to estimate the average concentration of ions in electrodes of the battery 102 and estimate the SOC of the battery 102 by Coulomb counting. The average concentration of ions in electrodes of the battery 102 is estimated using Equation 1 and the SOC of the battery is estimated using Equation 4.

At step 204, the method 200 includes correcting ion concentration based on a difference between predicted and measured cell voltages. The method 200 allows the corrector 106 to correct the ion concentration based on difference in predicted and measured cell voltages. From the averaged concentration and the radial concentration gradient, electrode surface concentration is evaluated. Using the surface concentration and the open circuit voltage (OCV) curve, equilibrium potential is evaluated. Also, reaction diffusion and the electrolyte potentials are evaluated using the inverted Butler-Volmer equation. The cell voltage is predicted accordingly from these potentials.

In an example, cell voltage measurements are obtained at a time intervals using the plurality of voltage sensors $102_1$ situated in the battery 102. The cell voltage data is assimilated with a battery model using a filtering technique. As the cell voltage prediction is non-linear in nature, an unscented Kalman filter (UKF) is used, as discussed above. The UKF estimates the Kalman gain using the data variance and the cross-covariance between the state and cell-voltage prediction. Using the estimated Kalman gain, a correction in the average concentration and the radial concentration gradient is obtained using Equations 5 and 6.

At step 206, the method 200 includes correcting the SOC based on a relation between SOC estimated by Coulomb counting and the average concentration, and the difference in cell voltages. The method 200 allows the corrector 106 to correct the SOC based on a relation between SOC estimated by Coulomb counting and the average concentration, and the difference in cell voltages. In an example, the SOC is corrected using the relation between the SOC, estimated by Coulomb counting, and the average concentration, and the difference in predicted and measured cell voltages using Equation 10. Further, the updated SOC is obtained using Equation 11.

The various actions, acts, blocks, steps, or other operations performed in the method 200 may be performed in the order presented, in a different order or simultaneously. Further, in some example, some of the actions, acts, blocks, steps, or other operations may be omitted, added, modified, skipped, or otherwise not performed without departing from the scope of the examples.

Figure 3A:
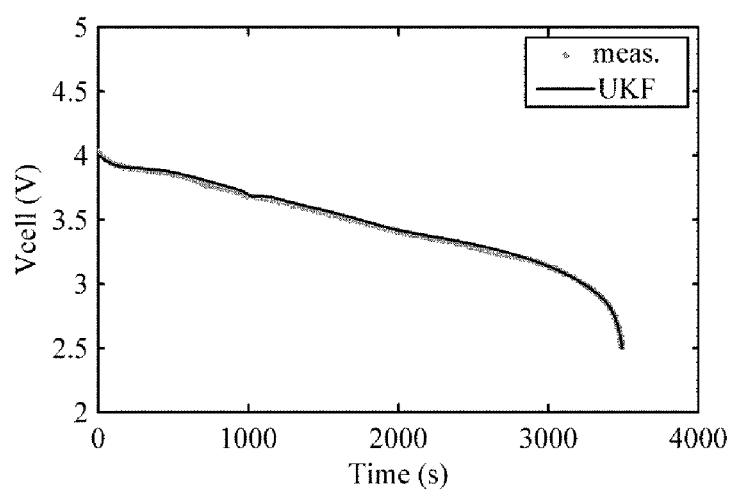
FIGS. 3A and 3B are graphs showing validation of voltage with time at room temperature and at low temperature respectively for a nickel cobalt aluminum oxide (NCA)/C cell, according to examples.
Figure 3B:
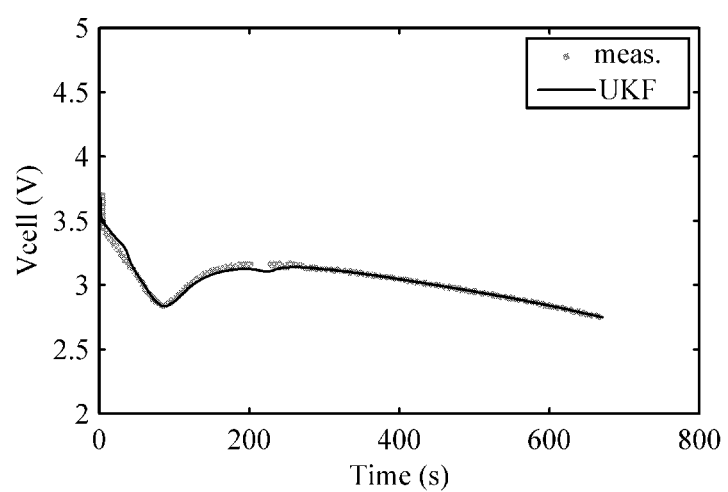

FIGS. 3A and 3B are graphs showing validation of voltage with time at room temperature and at low temperature, respectively, for the NCA/C cell, according to examples. The experimental data in these graphs is available for a Li-ion battery during discharge. With the proposed method, the cell voltage is predicted. The predicted cell voltage is compared with the proposed method using the UKF result, which is the cell voltage predicted by the proposed method after correction. As depicted in the examples of FIGS. 3A and 3B, the predicted cell voltage matches well with experimental measurements.

Figure 4A:
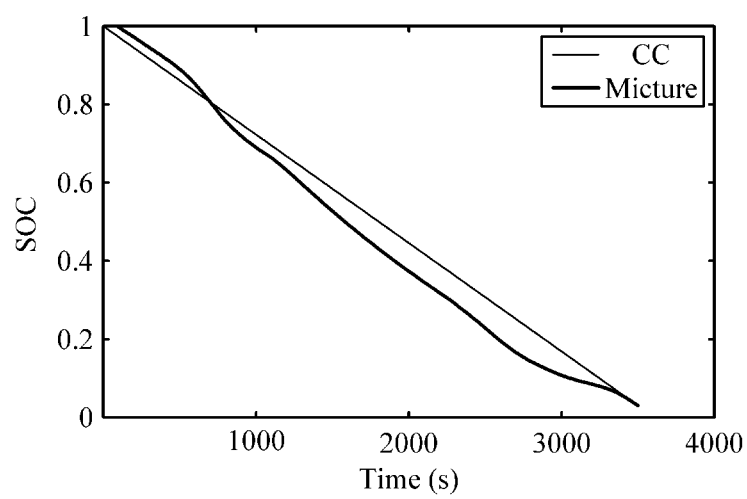
FIGS. 4A and 4B are graphs showing state-of-charge (SOC) estimation at room temperature and at low temperature respectively for the NCA/C cell, according to examples.
Figure 4B:
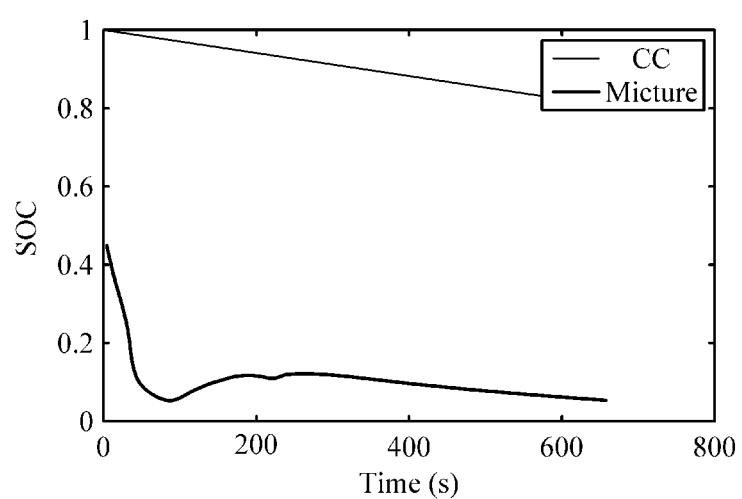

FIGS. 4A and 4B are graphs showing SOC estimation at room temperature and at low temperature respectively for the NCA/C cell, according to examples. The Coulomb counting SOC method, labeled CC, and updated SOC, labeled Mixture, is shown in the example of FIG. 4A. The Coulomb Counting method erroneously estimates remnant charge at the end of discharge. The proposed updated SOC method appropriately indicates a low SOC near the end of discharge as shown in the example of FIG. 4B.

Figure 5A:
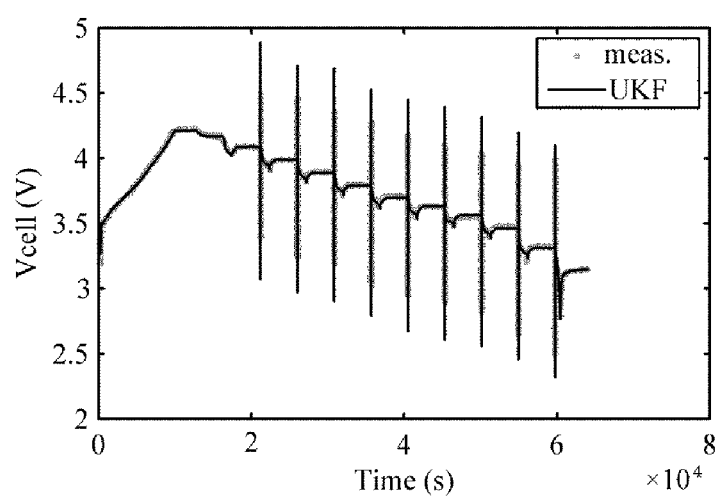
FIGS. 5A and 5B are graphs showing validation of voltage with time at room temperature for HPPC protocol and urban dynamometer driving schedule (UDDS) protocol respectively, according to examples.
Figure 5B:
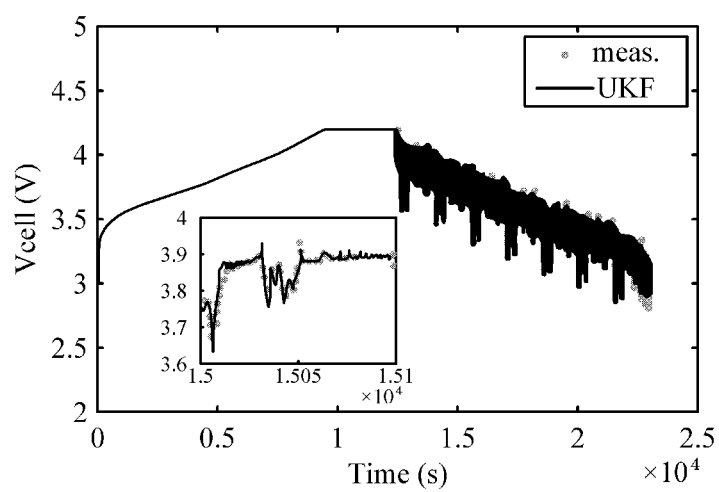

FIGS. 5A and 5B are graphs showing validation of voltage with respect to time at room temperature for an HPPC protocol and for the UDDS protocol, respectively, according to examples. The battery is studied by using the battery for a certain duration and then resting the battery 102 as being unused for a certain duration. A comparison of voltages, that is, predicted UKF and measured voltages is shown in the examples of FIGS. 5A and 5B for the HPPC protocol and UDDS protocol, respectively. The estimated voltage matches with the experimental measurements as shown in the example of FIG. 5A. Furthermore, in the example of FIG. 5B, the estimated voltage matches with the experimental measurements.

Figure 6A:
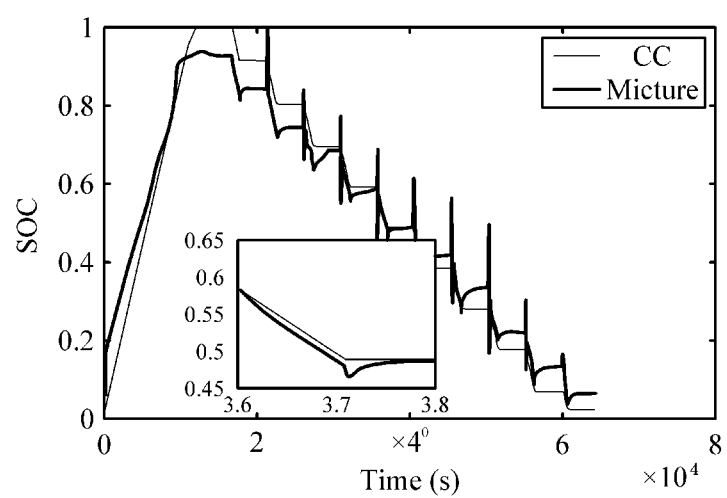
FIGS. 6A and 6B are graphs showing SOC estimation for hybrid pulse power characterization (HPPC) protocol and UDDS protocol respectively, according to examples.
Figure 6B:
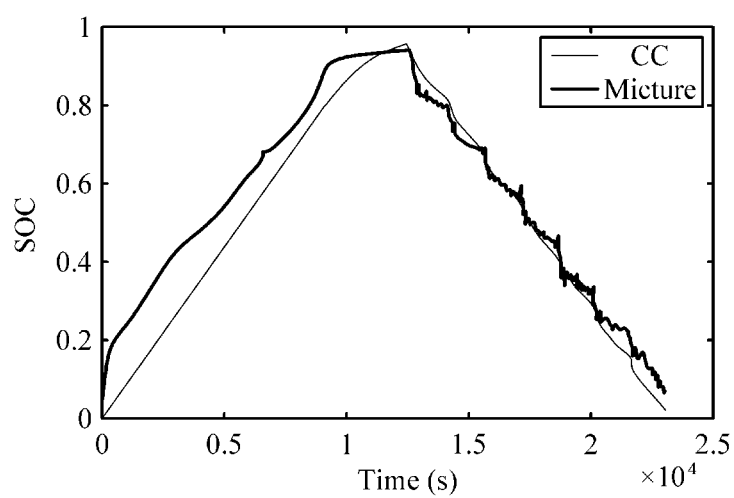

FIGS. 6A and 6B are graphs showing SOC estimation for the HPPC protocol and the UDDS protocol, respectively, according to examples. The proposed method appropriately accounts for pulse current and voltage relaxation during rest period as shown in the example of FIG. 6A. The SOC estimation for the UDDS protocol is shown in the example of FIG. 6B. In the example of FIG. 6B, rapid current changes in the battery 102 are not accounted for in the Coulomb counting method, whereas the proposed method accounts for rapid current changes, and the SOC is corrected in accordance to the rapid current changes, in the battery 102.

Figure 7A:
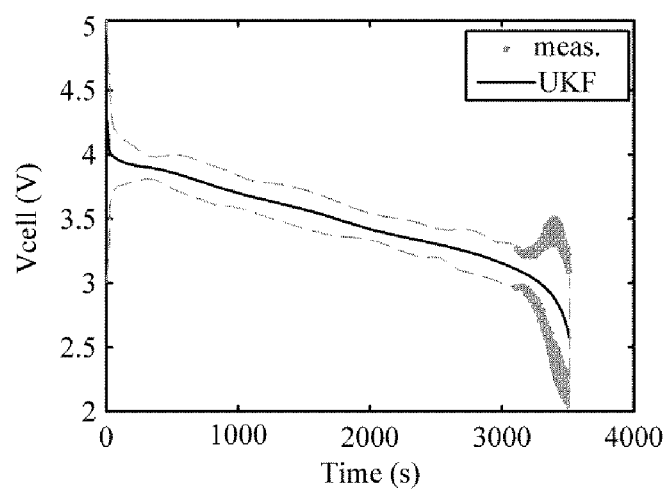
FIGS. 7A and 7B are graphs showing confidence bound on voltage prediction and SOC prediction respectively, according to examples.
Figure 7B:
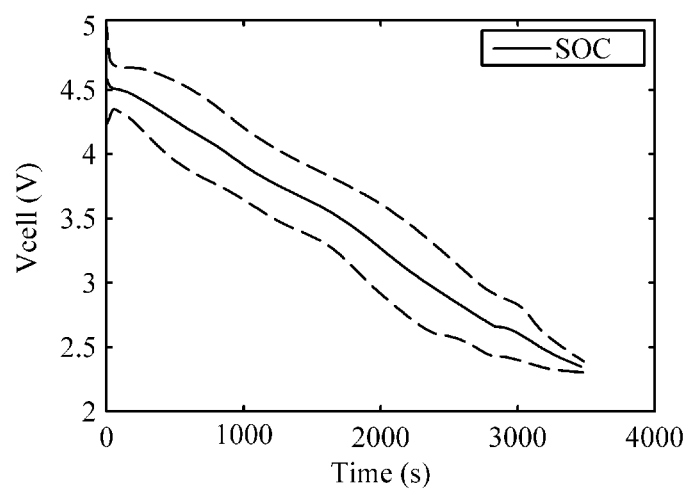

FIGS. 7A and 7B are graphs showing confidence bound on voltage prediction and SOC prediction respectively, according to examples. In addition to providing a prediction of cell voltage, the proposed method provides a value of the amount of uncertainty in the prediction of cell voltage. The example of FIG. 7A shows the estimated three-sigma limits on the cell voltage prediction and the example of FIG. 7B shows the corresponding three-sigma limits on the SOC prediction.

Figure 8:
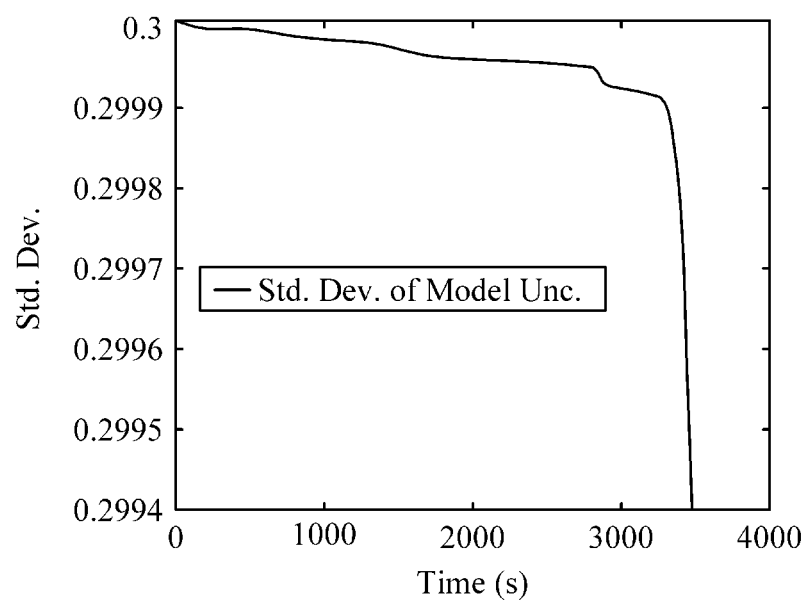
FIG. 8 is a graph showing standard deviation of model uncertainty, according to examples.

FIG. 8 is a graph showing a standard deviation of model uncertainty, according to the examples. The model uncertainty is given by a discrepancy in a simulator. In an example, the discrepancy in the simulator is modeled using the relationship $q \sim N(0, \sigma_q)$.

The mean and standard deviation of the variable q is updated using the UKF, as discussed further, above. Managing the discrepancy in this manner prevents overcorrection of states to match the data.

Figure 9A:
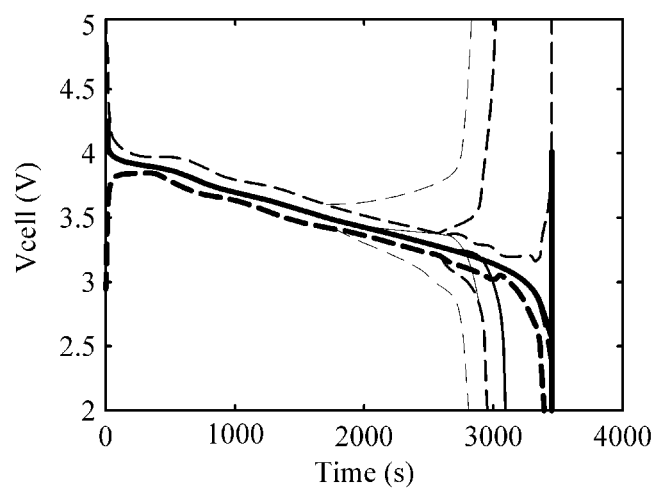
FIGS. 9A and 9B are graphs showing predictive capability of voltage estimation and SOC estimation, according to examples.
Figure 9B:
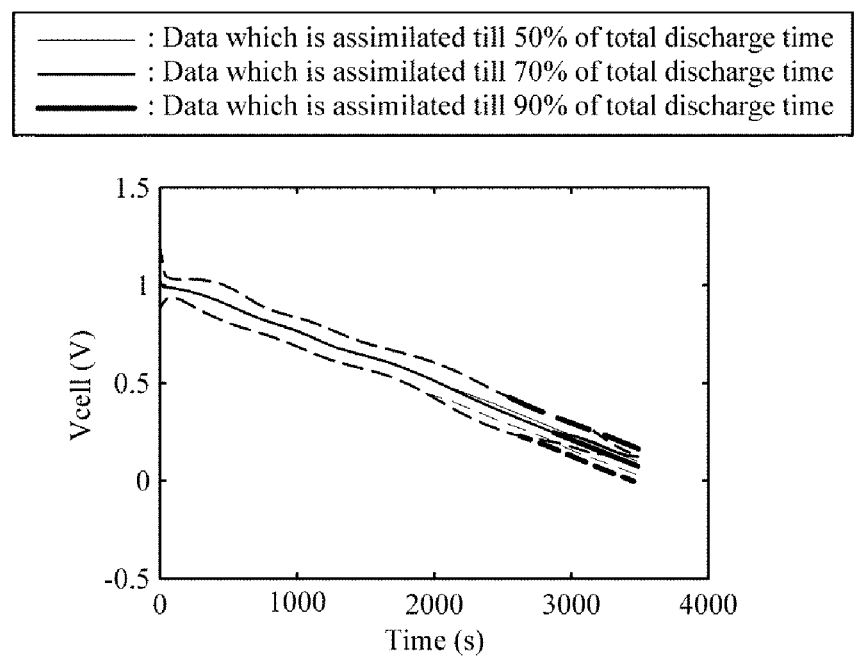

FIGS. 9A and 9B are graphs showing predictive capability of voltage estimation and SOC estimation, according to the examples. With respect to an example, where the battery 102 is used for certain duration and if the voltage of the battery 102 is to be determined for such an example, the prediction of voltage of the battery 102 at a given time instant is shown in the example of FIG. 9A. Furthermore, the corresponding SOC estimation value for the battery 102 is shown in the example of FIG. 9B.

Figure 10:
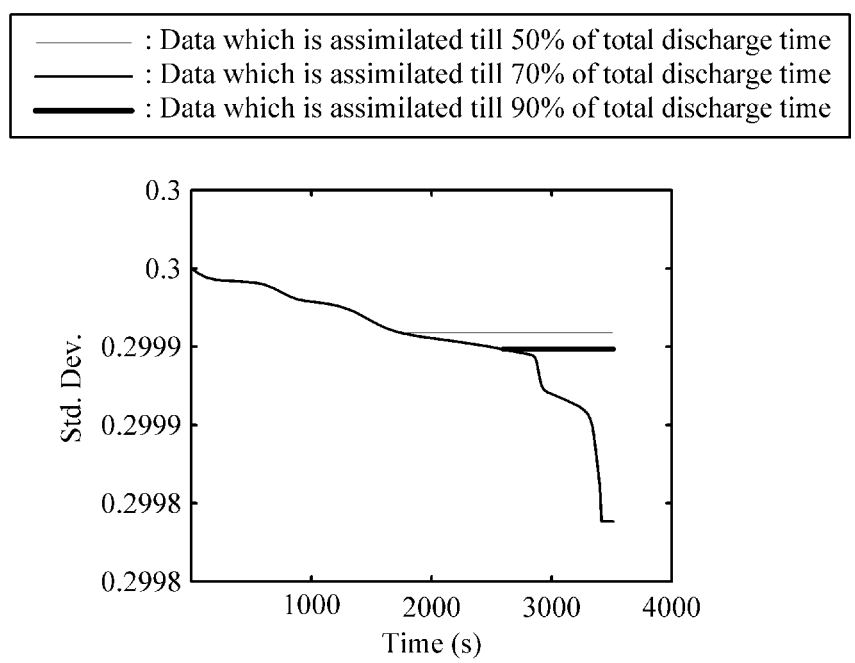
FIG. 10 is a graph showing updated standard deviation of model uncertainty described in the example of FIG. 8, according to examples.

FIG. 10 is a graph showing updated standard deviation of model uncertainty as described in the example of FIG. 8, according to the examples. In the example of FIG. 10, the data is assimilated and the updated standard deviation of model uncertainty is shown in the example of FIG. 10.

Figure 11A:
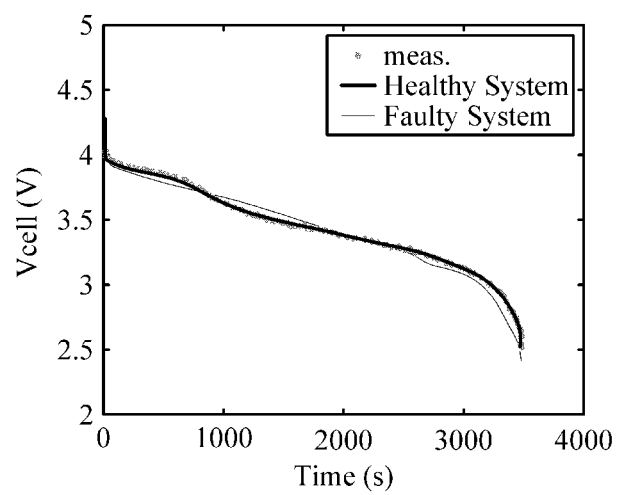
FIGS. 11A and 11B are graphs showing estimation of cell voltage in presence of system fault and a mean of model uncertainty, according to examples.
Figure 11B:
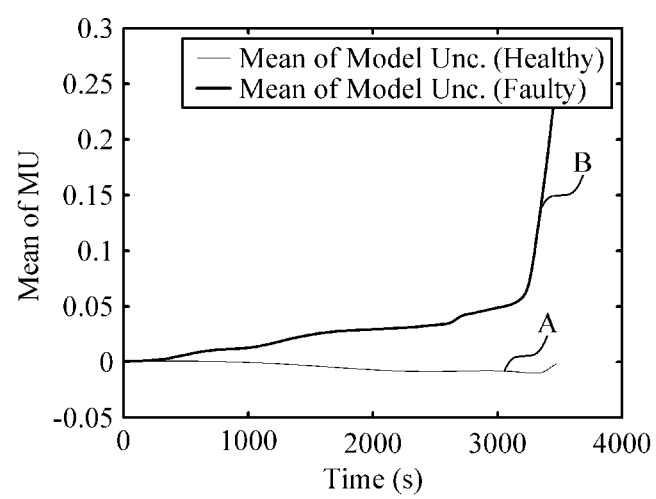

FIGS. 11A and 11B are graphs showing estimation of cell voltage in the presence of a system fault and a mean of model uncertainty, according to the examples. A simulation is performed to determine the effect of a faulty system in predicting the cell voltage. In the example of FIG. 11A, a comparison is made between cell voltage predicted for a healthy system and a corresponding cell voltage predicted for a faulty system. In the example of FIG. 11B, the mean of model uncertainty for a healthy system and the mean of model uncertainty for the faulty system are shown. In the example of FIG. 11B, the curve B, which is rising, indicates the faulty system.

Figure 12A:
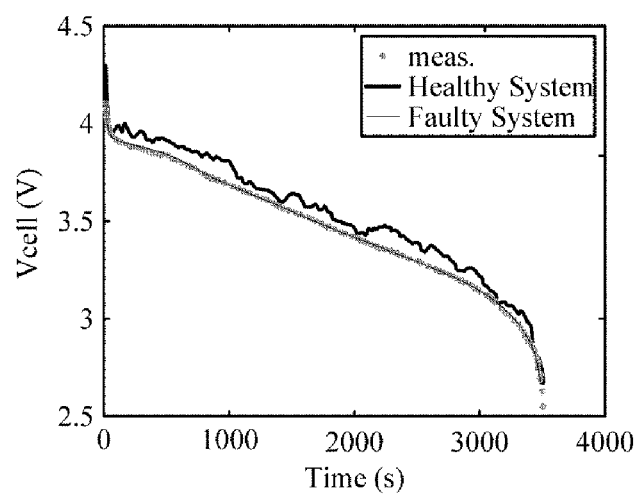
FIGS. 12A and 12B are graphs showing estimation of cell voltage in presence of sensor error and a mean of model uncertainty, according to examples.
Figure 12B:
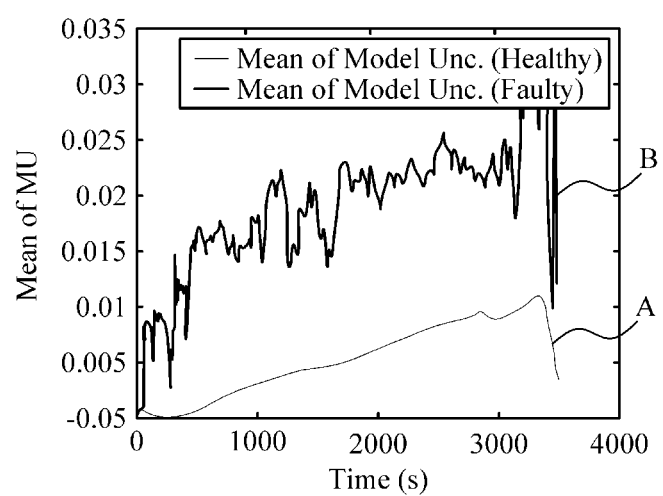

FIGS. 12A and 12B are graphs showing estimation of cell voltage in presence of sensor error and a mean of model uncertainty, according to examples. A simulation is made with a faulty sensor. Such a faulty sensor system is simulated by adding a biased normally distributed random noise to the measurement data. With the faulty sensor simulation, the proposed method is able to predict the cell voltage that is close to the actual cell voltage. For example, the voltage prediction remains within the 99% confidence bound. In the example of FIG. 12B, the curve B shows the predicted cell voltage and the measured cell voltage is shown by the curve A. In the example of FIG. 12B, the mean of model uncertainty is shown. In the example of FIG. 12B, the curve B, which is rising, indicates the faulty sensor system. Thus, the higher value of the mean of model uncertainty indicates a faulty sensor system. Accordingly, with the proposed method, the faulty sensor is identified and the proposed method is able to be used to correct the errors due to faulty sensors.

Figure 13:
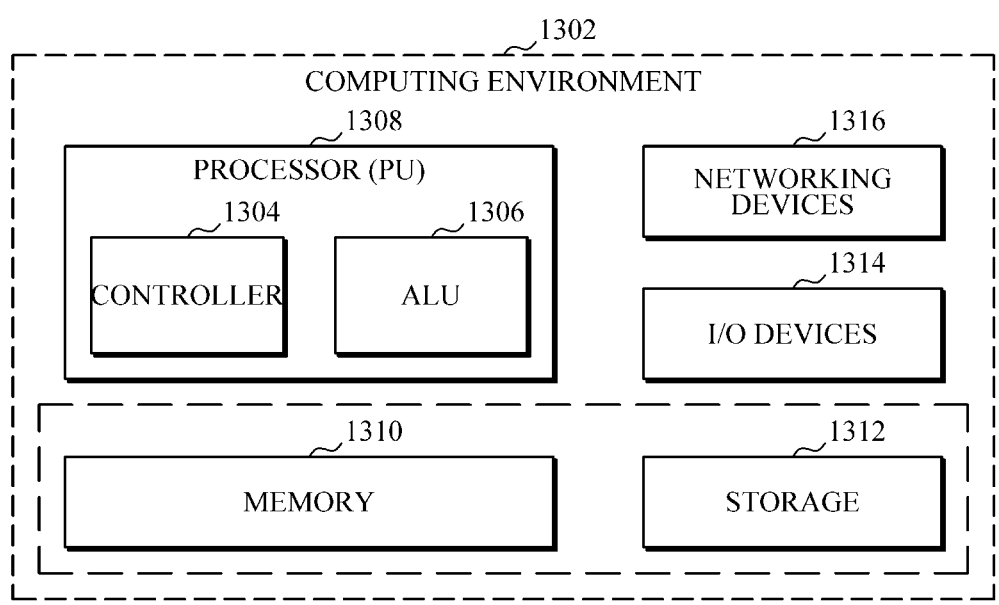
FIG. 13 illustrates a computing environment implementing the method for correction of ion concentration and Coulomb counting state-of-charge (SOC) in a battery, according to an example.

FIG. 13 illustrates a computing environment implementing the method for correction of ion concentration and Coulomb counting state-of-charge (SOC) in a battery, according to examples. As depicted in the example of FIG. 13, the computing environment 1302 includes at least one processor 1308 that is equipped with a controller 1304 and an Arithmetic Logic Unit (ALU) 1306, a memory 1310, a storage 1312, plurality of networking devices 1316 and a plurality Input output (I/O) devices 1314. However, while certain ones of these elements have been presented as being integrated, these various elements may be separate or may be integrated in different ways. The processor 1308 is responsible for processing the instructions of the algorithm. The processor 1308 receives commands from the controller 1304 in order to perform its processing. Furthermore, any logical and arithmetic operations involved in the execution of the instructions are computed with the help of the ALU 1306.

The overall computing environment 1302 may be composed of multiple homogeneous and/or heterogeneous cores, multiple CPUs of different kinds, special media and other accelerators. The processor 1308 is responsible for processing the instructions of the method. Further, there may be a plurality of processors 1308 that are located on a single chip or over multiple chips.

The instructions and codes used for an implementation are stored in either the memory 1310 or the storage 1312 or both. At the time of execution, the instructions may be fetched from the corresponding memory 1310 or storage 1312, and executed by the processor 1308.

In examples of hardware implementations, various networking devices 1316 or external I/O devices 1314 may be connected to the computing environment to support the implementation through providing networking and I/O functionality.

The estimators and correctors in FIG. 1 and I/O devices and networking devices in FIG. 13 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 2 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method, comprising:
   estimating an average concentration of ions in electrodes of a battery and estimating a state-of-charge (SOC) of the battery by Coulomb counting;
   correcting the ion concentration based on a difference in predicted and measured cell voltages; and
   correcting the Coulomb counting SOC based on a relation between SOC estimated by the Coulomb counting and the average concentration, and the difference in the predicted and measured cell voltages.

2. The method of claim 1, wherein correcting the ion concentration based on the difference in the cell voltages comprises:
   obtaining a predicted cell voltage while estimating the average concentration of ions;
   obtaining a measured cell voltage from sensors placed in the battery; and
   computing the difference between the predicted cell voltage and the measured cell voltage.

3. The method of claim 2, wherein obtaining the predicted cell voltage comprises using an unscented Kalman filter (UKF).

4. The method of claim 1, wherein the ions in the electrodes are lithium ions.

5. The method of claim 1, wherein the Coulomb counting takes an initial SOC and a current sensor measurement as inputs.

6. A battery management system, comprising:
   a processor configured to
   estimate an average concentration of ions in electrodes of the battery and estimate a state-of-charge (SOC) of the battery by Coulomb counting,
   correct the ion concentration based on a difference in predicted and measured cell voltages, and
   correct the Coulomb counting SOC based on a relation between SOC estimated by the Coulomb counting and the average concentration, and the difference in the predicted and measured cell voltages.

7. The battery management system of claim 6, further comprising a memory configured to store instructions,
   wherein the processor is further configured to execute the instructions to
   estimate the average concentration of ions in electrodes of the battery and estimate the state-of-charge (SOC) of the battery by Coulomb counting,
   correct the ion concentration based on a difference in predicted and measured cell voltages, and
   correct the Coulomb counting SOC based on the relation between SOC estimated by the Coulomb counting and the average concentration, and the difference in the predicted and measured cell voltages.

8. The battery management system of claim 6, wherein the processor comprises
   an estimator configured to
   estimate the average concentration of ions in electrodes of the battery and estimate the state-of-charge (SOC) of the battery by Coulomb counting; and
   a corrector configured to
   correct the ion concentration based on the difference in predicted and measured cell voltages, and
   correct the Coulomb counting SOC based on the relation between SOC estimated by the Coulomb counting and the average concentration, and the difference in the predicted and measured cell voltages.

9. The battery management system of claim 8, wherein the corrector is configured to correct the ion concentration based on a difference in cell voltages by:

obtaining a predicted cell voltage while estimating the average concentration of ions;

obtaining a measured cell voltage from sensors placed in the battery; and computing the difference between the predicted cell voltage and the measured cell voltage.

10. The battery management system of claim 9, wherein obtaining the predicted cell voltage comprises using an unscented Kalman filter (UKF).

11. The battery management system of claim 8, wherein the ions in the electrodes are lithium ions.

12. The battery management system of claim 8, wherein the Coulomb counting takes an initial SOC and a current sensor measurement as inputs.

13. A non-transitory computer-readable storage medium storing instructions that, when executed by a processor, cause the processor to estimate an average concentration of ions in electrodes of a battery and estimating a state-of-charge (SOC) of the battery by Coulomb counting;

correct ion concentration based on a difference in predicted and measured cell voltages; and correct the Coulomb counting SOC based on a relation between SOC estimated by the Coulomb counting and the average concentration, and the difference in the predicted and measured cell voltages.

* * * * *